(12) United States Patent
Chun et al.

(10) Patent No.: US 10,778,238 B1
(45) Date of Patent: Sep. 15, 2020

(54) DUAL-SLOPE ANALOG TO DIGITAL CONVERTER HAVING PARALLEL COUNTING STRUCTURE

(71) Applicant: Samsung Electro-Mechanics Co., Ltd., Suwon-si (KR)

(72) Inventors: Ji Buem Chun, Suwon-si (KR); Joon Hyung Lim, Suwon-si (KR); Jin Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/661,314

(22) Filed: Oct. 23, 2019

(30) Foreign Application Priority Data

Jul. 3, 2019 (KR) .................. 10-2019-0080185

(51) Int. Cl.
*H03M 1/06* (2006.01)
*H03M 1/10* (2006.01)
*H03M 1/12* (2006.01)

(52) U.S. Cl.
CPC ............ *H03M 1/0607* (2013.01); *H03M 1/06* (2013.01); *H03M 1/10* (2013.01); *H03M 1/12* (2013.01)

(58) Field of Classification Search
CPC ............ H03M 1/06; H03M 1/12; H03M 1/10
USPC ................................ 341/118, 155, 120, 126
See application file for complete search history.

(56) References Cited

U.S. PATENT DOCUMENTS

| 4,270,119 | A | | 5/1981 | Mitamura |
| 5,612,698 | A | * | 3/1997 | Reay ..................... H03M 1/181 341/155 |
| 6,906,648 | B1 | | 6/2005 | Koike |

* cited by examiner

*Primary Examiner* — Joseph J Lauture
(74) *Attorney, Agent, or Firm* — NSIP Law

(57) ABSTRACT

A dual-slope analog-to-digital converter includes a switching circuit, an integrating circuit, a dual comparison circuit, and a control circuit. The integrating circuit is configured to perform a charging operation having a first slope, based on a magnitude of an input voltage selected by the switching circuit, and a discharging operation having a second slope, based on a magnitude of the reference voltage selected by the switching circuit, and output a first voltage. The dual comparison circuit is configured to output a first comparison signal by comparing the first voltage with a first reference voltage and output a second comparison signal by comparing a second reference voltage, higher than the first reference voltage, with the first voltage. The control circuit is configured to output a digital value corresponding to the magnitude of the input voltage, based on a first count value and a second count value.

20 Claims, 6 Drawing Sheets

DUAL-SLOPE ANALOG TO DIGITAL CONVERTER HAVING PARALLEL COUNTING STRUCTURE

CROSS-REFERENCE TO RELATED APPLICATION(S)

This application claims benefit under 35 USC 119(a) of Korean Patent Application No. 10-2019-0080185 filed on Jul. 3, 2019 in the Korean Intellectual Property Office, the entire disclosure of which is incorporated herein by reference for all purposes.

BACKGROUND

1. Field

The following description relates to a dual-slope analog-to-digital converter having a parallel counting structure.

2. Description of Related Art

In general, to measure analog signals, such as voltage and current, and convert such signals into digital values, a sensor and an analog-to-digital converter (ADC) may be required.

In a system that includes an ADC, the resolution of the ADC is one of the primary considerations in the performance of the overall system. Typically, resolution means the smallest change in the analog input to change the digital output value, and in general, an increase in the number of bits of an ADC is advantageous. In other words, the resolution is the ability to precisely read the amount of analog input to be converted into a digital value.

Here, to increase the resolution of an ADC, the design difficulty may be increased. Therefore, it is necessary to research and develop an ADC capable of increasing the resolution without increasing the design or implementation difficulty.

Among existing ADCs, a dual-slope ADC may be charged based on a charging slope corresponding to the magnitude of an input voltage, may be discharged based on a discharging slope corresponding to the magnitude of a reference voltage, and may output a digital count value corresponding to the magnitude of the input voltage by counting a rising time based on the charge and a falling time based on the discharge.

Such a dual-slope ADC has the advantage of being independent of process variations because the output is determined by counting the rising time and the falling time.

However, since typical dual-slope ADC performs counting using a clock signal, the resolution is determined based on the frequency of a clock signal used and the resolution may be increased by using a clock signal having a high frequency. However, there is a disadvantage in that an expensive clock generator may be required to generate the high frequency, thus, increasing cost. Therefore, a technique for increasing the resolution of an ADC is required even in the case of using the same clock signal.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a dual-slope analog-to-digital converter (ADC) includes a switching circuit, an integrating circuit, a dual comparison circuit, and a control circuit. The switching circuit is configured to select one of an input voltage for a charging operation and a reference voltage for a discharging operation. The integrating circuit is configured to perform a charging operation having a first slope, based on a magnitude of the input voltage selected by the switching circuit, and a discharging operation having a second slope, based on a magnitude of the reference voltage selected by the switching circuit, and output a first voltage varying responsively to the charging operation and the discharging operation. The dual comparison circuit is configured to output a first comparison signal by comparing the first voltage with a first reference voltage and output a second comparison signal by comparing a second reference voltage, higher than the first reference voltage, with the first voltage. The control circuit is configured to output a digital value corresponding to the magnitude of the input voltage, based on a first count value of the first comparison signal and a second count value of the second comparison signal.

The switching circuit may be configured to select the input voltage for the charging operation until a first time point elapses, and select the reference voltage for the discharging operation after the first time point has elapsed.

The integrating circuit may be configured to output the first voltage increasing to the first slope upon performing the charging operation until the first time point elapses, and output the first voltage decreasing to the second slope upon performing the discharging operation after the first time point has elapsed.

The integrating circuit may include an integrator including a first operational amplifier including a first input terminal connected to an output terminal of the switching circuit and a second input terminal connected to a ground; a first resistor connected to the first input terminal of the first operational amplifier; a first capacitor connected to the first operational amplifier in parallel, and connected between the first input terminal and the output terminal of the first operational amplifier; and a first switch connected to the first capacitor in parallel.

The dual comparison circuit may include a first comparator configured to output the first comparison signal by comparing the first voltage from the integrating circuit with the first reference voltage; a second comparator configured to output the second comparison signal by comparing the second reference voltage, higher than the first reference voltage, with the first voltage; and a fast discharge circuit configured to discharge the input voltage of the comparison circuit after a counting operation of the control circuit.

The fast discharge circuit may include a discharge switch and a discharge current source serially connected between a ground and a first connection node, between an output terminal of the integrating circuit and an input terminal of the second comparator. The discharge switch may be configured to be switched from an OFF state to an ON state, based on a third control signal after completion of a discharging operation of the integrating circuit. The discharge current source may be configured to discharge a voltage at the first connection node to the ground when the discharge switch is in an ON state.

The integrating circuit may further include an offset elimination circuit connected between the first input terminal and the second input terminal of the first operational amplifier to connect the first input terminal and the second input terminal to each other after completion of the discharging operation to remove a direct current (DC) offset voltage of an input side of the first operational amplifier.

The control circuit may include a first counter configured to count the first comparison signal, using a first clock signal, and output the first count value; a second counter configured to count the second comparison signal, using a second clock signal having a phase different from a phase of the first clock signal by 90 degrees, and output the second count value; and a controller configured to output a digital value corresponding to the magnitude of the input voltage, based on the first count value and the second count value.

In another general aspect, a dual-slope analog-to-digital converter (ADC) includes a switching circuit, an integrating circuit, a dual comparison circuit, and a control circuit. The switching circuit is configured to select one of an input voltage for a charging operation and a reference voltage for a discharging operation. The integrating circuit is configured to perform a charging operation having a first slope, based on a magnitude of the input voltage selected by the switching circuit, and a discharging operation having a second slope, based on a magnitude of the reference voltage selected by the switching circuit, and output a first voltage varying responsively to the charging operation and the discharging operation. The dual comparison circuit is configured to output a first comparison signal by comparing the first voltage a first reference voltage and output a second comparison signal by comparing a second reference voltage, higher than the first reference voltage, with the first voltage. The control circuit is configured to output a digital value corresponding to the magnitude of the input voltage, based on a first count value generated by counting the first comparison signal in response to a first clock signal and a second count value generated by counting the second comparison signal in response to a second clock signal having a phase different from a phase of the first clock signal.

The switching circuit may be configured to select the input voltage for the charging operation until a first time point elapses, and select the reference voltage for the discharging operation after the first time point has elapsed.

The integrating circuit may be configured to output the first voltage increasing to the first slope upon performing the charging operation until the first time point elapses, and output the first voltage decreasing to the second slope upon performing the discharging operation after the first time point has elapsed.

The integrating circuit may include an integrator including a first operational amplifier including a first input terminal connected to an output terminal of the switching circuit and a second input terminal connected to a ground; a first resistor connected to the first input terminal of the first operational amplifier; a first capacitor connected to the first operational amplifier in parallel, and connected between the first input terminal and the output terminal of the first operational amplifier; and a first switch connected to the first capacitor in parallel.

The dual comparison circuit may include a first comparator configured to output the first comparison signal by comparing the first voltage from the integrating circuit with the first reference voltage; a second comparator configured to output the second comparison signal by comparing the second reference voltage, higher than the first reference voltage, with the first voltage; and a fast discharge circuit configured to discharge the input voltage of the comparison circuit after a counting operation of the control circuit.

The fast discharge circuit may include a discharge switch and a discharge current source serially connected between a ground and a first connection node between an output terminal of the integrating circuit and an input terminal of the second comparator. The discharge switch may be configured to be switched from an OFF state to an ON state, based on a third control signal after completion of a discharging operation of the integrating circuit. The discharge current source may be configured to discharge a voltage at the first connection node to the ground when the discharge switch is in an ON state.

The integrating circuit may further include an offset elimination circuit connected between the first input terminal and the second input terminal of the first operational amplifier to connect the first input terminal and the second input terminal after completion of the discharging operation to remove a direct current (DC) offset voltage of an input side of the first operational amplifier.

The control circuit may include a first counter configured to count the first comparison signal, using the first clock signal, and output the first count value; a second counter configured to count the second comparison signal, using the second clock signal having a phase different from a phase of the first clock signal by 180 degrees, and outputting the second count value; and a controller configured to output a digital value corresponding to the magnitude of the input voltage, based on the first count value and the second count value.

In another general aspect, a dual-slope analog-to-digital converter (ADC) includes a switching circuit, an integrating circuit, a dual comparison circuit, and a control circuit. The switching circuit is configured to select one of an input voltage for a charging operation and a reference voltage for a discharging operation. The integrating circuit, connected to the selected input voltage and the selected reference voltage, is configured to perform a charging operation having a first slope based on a magnitude of the selected input voltage and a discharging operation having a second slope based on a magnitude of the reference voltage, and output a first voltage varying responsively to the charging operation and the discharging operation. The dual comparison circuit, connected to the first voltage, is configured to output a first comparison signal by comparing the first voltage with a first reference voltage and output a second comparison signal by comparing a second reference voltage, higher than the first reference voltage, with the first voltage. The control circuit, connected to the first comparison signal and the second comparison signal, is configured to output a digital value corresponding to the magnitude of the input voltage, based on the first comparison signal and the second comparison signal.

The digital value corresponding to the magnitude of the input voltage may be based on a first count value of the first comparison signal and a second count value of the second comparison signal.

The first slope may be different from the second slope.

The switching circuit may be configured to select the input voltage for the charging operation until a first time point elapses, and select the reference voltage for the discharging operation after the first time point has elapsed.

The integrating circuit may include a first operational amplifier having a first input terminal connected to an output terminal of the switching circuit and a second input terminal connected to a ground; and a first capacitor connected to the first operational amplifier in parallel, and connected between the first input terminal and the output terminal of the first operational amplifier.

The first time point may be a charging duration of time the first capacitor.

The integrating circuit may be further configured to output the first voltage increasing to the first slope upon performing the charging operation until the first time point elapses, and output the first voltage decreasing to the second slope upon performing the discharging operation after the first time point has elapsed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
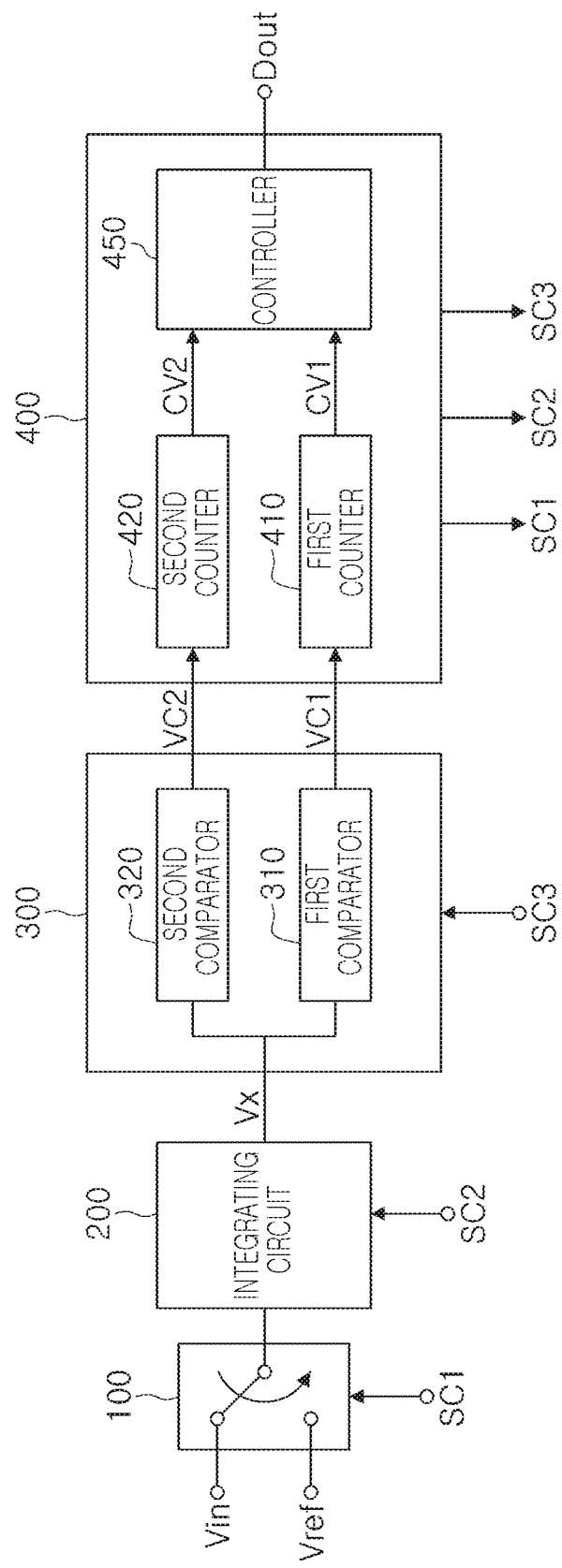
FIG. 1 is a block diagram of a dual-slope analog-to-digital converter according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative sizes, proportions, and depictions of elements in the drawings may be exaggerated for clarity, illustration, and convenience.

Subsequently, examples are described in further detail with reference to the accompanying drawings.

In the drawings, the same reference numerals will be used throughout to designate the same or like elements.

Figure 2:
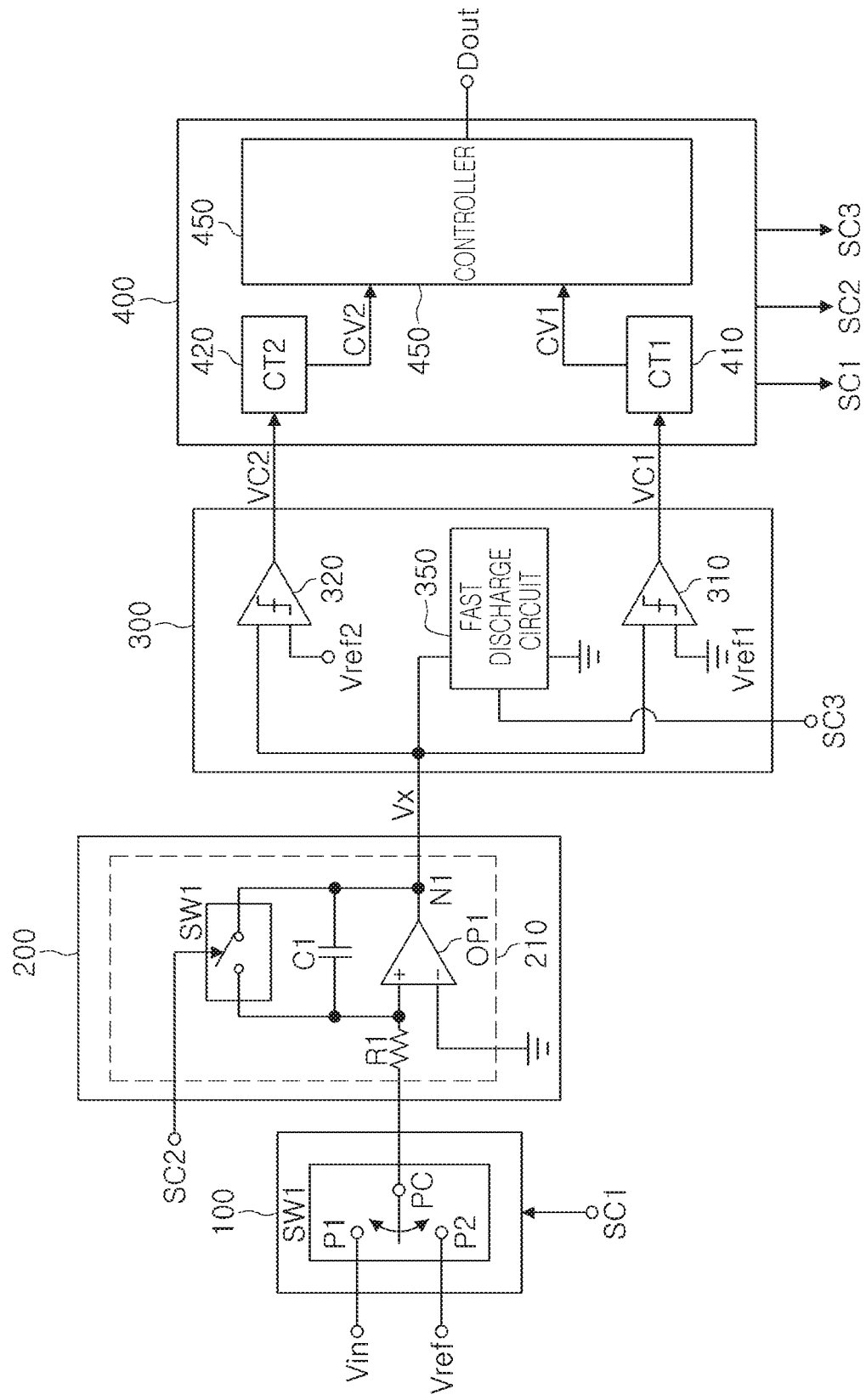
FIG. 2 is a circuit diagram of a dual-slope analog-to-digital converter according to an example.

FIG. 1 is a block diagram of a dual-slope analog-to-digital (ADC) converter according to an example. FIG. 2 is a circuit diagram of a dual-slope analog-to-digital converter according to an example.

Referring to FIGS. 1 and 2, a dual-slope analog-to-digital converter according to an example may include a switching circuit 100, an integrating circuit 200, a dual comparison circuit 300, and a control circuit 400.

The switching circuit 100 may select one of an input voltage Vin for a charging operation and a reference voltage Vref for a discharging operation.

As an example, the switching circuit 100 may select the input voltage Vin for the charging operation in response to a first control signal SC1, and may then select the reference voltage Vref for the discharging operation.

The integrating circuit 200 performs a charging operation having a first slope SLV1 based on a magnitude of the input voltage Vin selected by the switching circuit 100, a discharging operation having a second slope SL22 based on a magnitude of the reference voltage Vref selected by the switching circuit 100, and may output a first voltage Vx changing during the charging operation and the discharging operation.

As an example, the integrating circuit 200 may remove an operation reset of the integrating circuit 200 and a direct current (DC) offset voltage of an input side of the integrating circuit 200 in response to a second control signal SC2, which will be described later.

The dual comparison circuit 300 outputs a first comparison signal VC1 by comparing the first voltage Vx from the integrating circuit 200 with a first reference voltage Vref1 (see FIG. 2), and may output a second comparison signal VC2 by comparing a second reference voltage Vref2 (see FIG. 2) higher than the first reference voltage Vref1 with the first voltage Vx.

In an example, the dual comparison circuit 300 may include a first comparator 310 and a second comparator 320.

The first comparator 310 may output the first comparison signal VC1 by comparing the first voltage Vx from the integrating circuit 200 with and the first reference voltage Vref1 (see FIG. 2). The second comparator 320 may output the second comparison signal VC2 by comparing the second reference voltage Vref2 (see FIG. 2), higher than the first reference voltage Vref1 (see FIG. 2), with the first voltage Vx.

As an example, the dual comparison circuit 300 may discharge a voltage at an input terminal of the dual comparison circuit 300. In detail, a voltage at an input terminal of the second comparator 320 may be discharged to a ground at high speed, in response to a third control signal SC3, to perform the next charging and discharging operation after completion of the discharging operation of the integrating circuit 200.

The control circuit 400 may output a digital value Dout corresponding to the magnitude of the input voltage Vin based on a first count value CV1, based on the first comparison signal VC1 from the dual comparison circuit 300, and a second count value CV2, based on the second comparison signal VC2.

As an example, the control circuit 400 may include a first counter 410, a second counter 420, and a controller 450.

The first counter 410 may count the first comparison signal VC1 and may output the first count value CV1. The second counter 420 may count the second comparison signal VC2 and may output the second count value CV2. The controller 450 may output the digital value Dout corresponding to the magnitude of the input voltage Vin, based on the first count value CV1 and the second count value CV2.

In the drawings of the disclosure, unnecessary duplicate descriptions of the same reference numerals and the same functional elements may be omitted, and a description of differences will be described.

Referring to FIG. 2, the switching circuit 100 may include a first terminal P1 receiving the input voltage Vin, a second terminal P2 receiving the reference voltage Vref, and a common terminal PC connected to the integrating circuit 200.

As an example, in the case of the switching circuit 100, in response to the first control signal SC1, the common terminal PC is connected to the first terminal P1 during a charging operation and connected to the second terminal P2 during a discharging operation.

The integrating circuit 200 may include, for example, an integrator 210.

The integrator 210 may include a first operational amplifier OP1, a first resistor R1, and a first capacitor C1. In addition, the integrating circuit 200 may include a first switch SW1.

The first operational amplifier OP1 may include a first input terminal (for example, +input terminal) connected to an output terminal of the switching circuit 100, and a second input terminal (for example, −input terminal) connected to the ground. The first resistor R1 may be connected to the first input terminal of the first operational amplifier OP1. The first capacitor C1 may be connected between the first input terminal and the output terminal of the first operational amplifier OP1 while being in parallel to the first operational amplifier OP1.

For example, the integrating circuit 200 may perform a charging operation having the first slope SLV1 until a first time point T1 elapses to output the first voltage Vx increasing to the first slope SLV1, and may perform a discharging operation having the second slope SLV2, after the first time point T1 has elapsed, to output the first voltage Vx reduced to the second slope SLV2. In an example, the first time point T1 has a duration defined by the time it takes to complete a charging operation of a capacitor.

The first switch SW1 is connected to the first capacitor C1 in parallel to cause both ends of the first capacitor C1 to be shorted, such that after the series of charging and discharging operations are completed by the integrating circuit 200, a series of charging and discharging operations may be started subsequently rapidly.

As an example, the first comparator 310 may compare the first voltage Vx from the integrating circuit 200 with the first reference voltage Vref1 and may output the first comparison signal VC1 having a high-level voltage, when the first voltage Vx is higher than the first reference voltage Vref (for example, zero voltage).

As an example, the second comparator 320 may compare the first voltage Vx from the integrating circuit 200 with the second reference voltage Vref2, and may output the second comparison signal VC2 having a high-level voltage, when the first voltage Vx is higher than the second reference voltage Vref2 (for example, ½ of a maximum input voltage).

In an example, a fast discharge circuit 350 may connect a first connection node N1, between the output terminal of the integrating circuit 200 and the input terminal of the second comparator 320, to the ground, in response to the third control signal SC3 after completion of the discharging operation by the integrating circuit 200. Thus, discharging a voltage at the input terminal of the dual comparison circuit 300, a voltage at the input terminal of the second comparator 310, at high speed.

The first counter 410 counts the first comparison signal VC1 received from the first comparator 310 by using the first clock signal CLK1 (see FIG. 8) to output the first count value CV1.

The second counter 420 counts the second comparison signal VC2 received from the second comparator 320 by using the second clock signal CLK2 (see FIG. 8) to output the second count value CV2.

The controller 450 may output the digital value Dout corresponding to the magnitude of the input voltage Vin, based on the first count value CV1 and the second count value CV2.

As such, since the digital value Dout may be provided using the first count value CV1 and the second count value CV2 based on the parallel counting operation, a counting operation at high speed may be performed.

Figure 3:
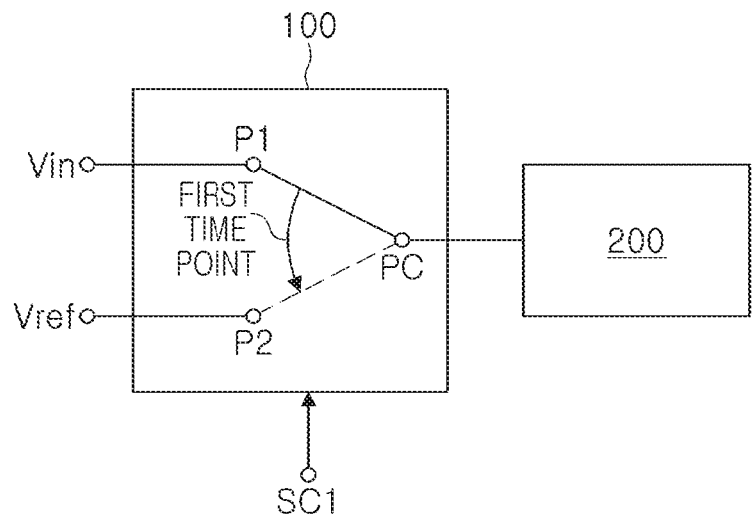
FIG. 3 is a diagram illustrating a switching circuit according to an example.

FIG. 3 is a diagram illustrating a switching circuit according to an example.

Referring to FIG. 3, for example, in response to the first control signal SC1, the switching circuit 100 may selectively connect the common terminal PC to the first terminal P1 after a first time point T1 elapses to select the input voltage Vin for the charging operation and output the selected voltage to the integrating circuit 200.

In response to the first control signal SC1, the switching circuit 100 connects the common terminal PC to the second terminal P2 after the first time point T1 has elapsed to select the reference voltage Vref for the discharging operation and output the selected voltage to the integrating circuit 200.

For example, the input voltage Vin may be 0V to 3.3V but is not limited thereto. In this case, the reference voltage Vref may be set to be lower than the input voltage.

Figure 4:
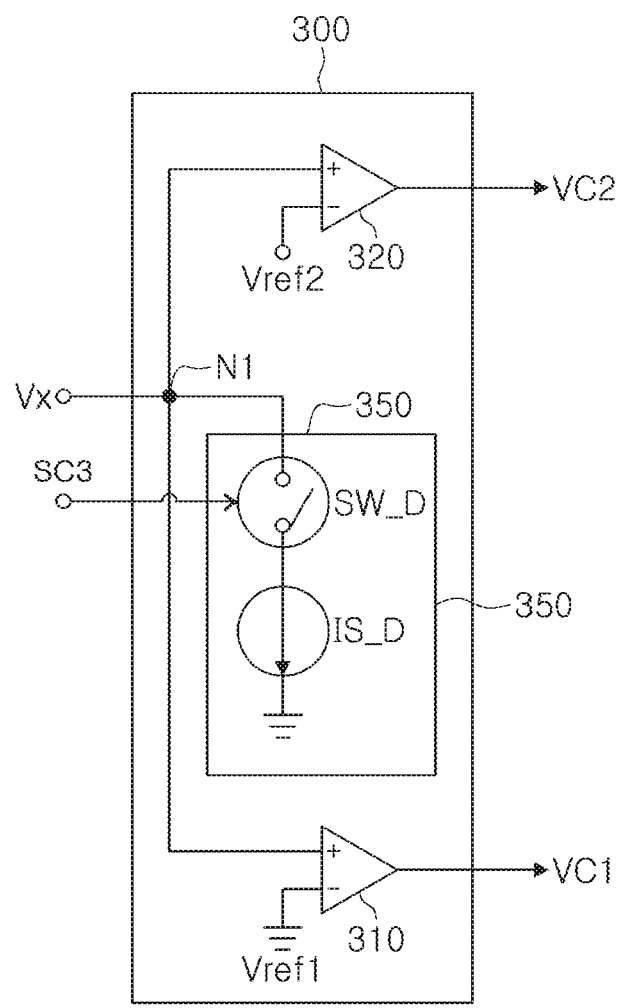
FIG. 4 is a diagram illustrating an example of a fast discharge circuit of a comparison circuit of FIG. 2.

FIG. 4 is a diagram illustrating an example of a fast discharge circuit of the comparison circuit of FIG. 2.

Referring to FIG. 4, the dual comparison circuit 300 may include a first comparator 310, a second comparator 320, and a fast discharge circuit 350.

The fast discharge circuit 350 may discharge the input voltage of the comparison circuit after the counting operation of the control circuit.

For example, the fast discharge circuit 350 may include a discharge switch SW-D and a discharge current source IS-D which are connected between the first connection node N1 between the common input terminal of the first and second comparators 310 and 320 and the output terminal of the integrating circuit 200, and the ground, in series.

For example, the discharge switch SW-D may include at least one switching element and may be switched from an OFF state to an ON state after completion of the discharging operation and before the start of a subsequent counting operation.

The discharge current source IS-D may discharge the voltage at the first connection node N1 to the ground at high speed when the discharge switch SW-D is in an ON state.

By the operation of the fast discharge circuit 350 as described above, after completion of the preceding counting operation, the input voltage of the comparator included in the parallel counting structure may be discharged at high speed. Accordingly, the following counting operation may be restarted more rapidly, without error, and a faster counting operation may also be performed.

Figure 5:
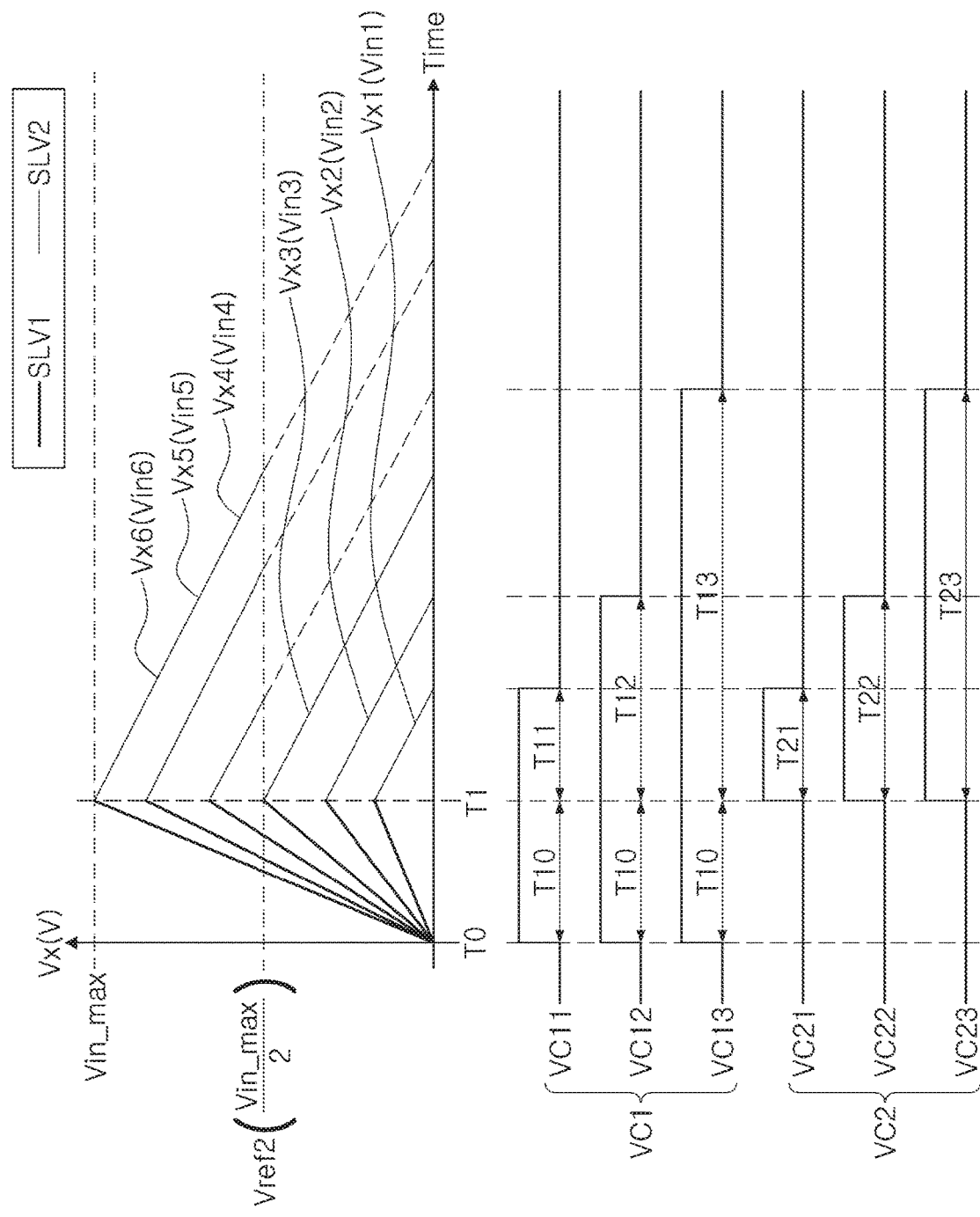
FIG. 5 is a diagram illustrating an example of a first voltage of an integrating circuit, and a first comparison signal and a second comparison signal of a comparison circuit of FIG. 4.

FIG. 5 is a diagram illustrating an example of a first voltage of the integrating circuit, and a first comparison signal and a second comparison signal of the comparison circuit of FIG. 4.

Referring to FIGS. 4 and 5, the first voltage Vx output from the integrating circuit 200 rises with the first slope SLV1 during the charging operation performed until the first time point T1 elapses, and descends with the second slope SLV2 during the discharging operation performed after the first time point T1 has elapsed.

As an example, the first slope SLV1 of the first voltage Vx may be represented by Equation 1 below, and the second slope SLV2 of the first voltage Vx may be represented by Equation 2 below.

$$SLV1 = Vin/(R \times C) \qquad \text{[Equation 1]}$$

$$SLV2 = Vref/(R \times C) \qquad \text{[Equation 2]}$$

In Equations 1 and 2, R is a resistance value of the first resistor R1 connected to the first input terminal of the first operational amplifier OP1, and C is a capacitance value of the first capacitor C1.

During the charging operation, the first slope SLV1 of the first voltage Vx is based on the magnitude of the input voltage Vin, and may thus be changed as the magnitude of the input voltage Vin may change. During the discharging operation, the second slope SLV2 of the first voltage Vx is the same based on the magnitude of the reference voltage Vref since the magnitude of the reference voltage Vref is the same without changing.

For example, FIG. 5 depicts six first voltages Vx1, Vx2, Vx3, Vx4, Vx5 and Vx6, in which the level of the first voltage Vx gradually increases. Vx1, Vx2, Vx3, Vx4, Vx5 and Vx6 may correspond to input voltages Vin1, Vin2, Vin3, Vin4, Vin5 and Vin6 in which the level gradually increases, respectively. In this case, the highest input voltage, Vin6, among the input voltages may be equal to or less than the maximum voltage Vin_max of the input voltage Vin.

As an example, when the input maximum voltage Vin_max is 3.3V, the input voltages Vin1, Vin2, Vin3, Vin4, Vin5, and Vin6 may be 0.5V, 1.0V, 1.5V, 2.0V, 2.5V, and 3.0V, respectively, but examples thereof are not limited thereto.

For example, the first comparator 310 may output VC11, VC12 and VC13, which are the first comparison signals VC1 and correspond to the input voltages Vin1, Vin2 and Vin3, respectively, corresponding to a voltage magnitude between a first reference voltage Vref1 (for example, 0V) and a second reference voltage Vref2 (for example, 1.65V). In this case, the first comparison signals VC1, for example, VC11, VC12, and VC13 correspond to first count values of the first counter 410, 'T10+T11', 'T10+T12', and 'T10+T13', respectively.

The second comparator 320 may output second comparison signals VC2, for example, VC21, VC22, and VC23, which correspond to the input voltages Vin4, Vin5 and Vin6, respectively, corresponding to a voltage level higher than the second reference voltage Vref2 (for example, 1.65V). In this case, the second count values VC21, VC22, and VC23 may correspond to the second count values T21, T22, and T23 of the second counter 420.

In this case, the controller 450 may output the digital value Dout corresponding to the magnitudes of the input voltage Vin, using the first count values 'T10+T11', 'T10+T12' and 'T10+T13' of the first counter 410 and the count values T21, T22 and T23 of the second counter 420.

As an example, when the input maximum voltage Vin_max is 3.3V and the input voltage Vin1 is 0.5V, the first comparator 310 may output the first comparison signal VC1, for example, VC11, corresponding to the input voltage Vin1 higher than the first reference voltage Vref1 (for example, 0V). In this case, VC11 of the first comparison signal VC1 may correspond to the first count value 'T10+T11' of the first counter 410. In this case, since the input voltage Vin1 is 0.5V and is not higher than the second reference voltage Vref2 (for example, 1.65V) in the second comparator 320, the first comparison signal VC1 having a low level is output and the first count value is zero.

In this case, the controller 450 may output the digital value Dout corresponding to the magnitude of the input voltage Vin, using only 'T10+T11', which is the first count value of the first counter 410.

As another example, when the input maximum voltage Vin_max is 3.3V and the input voltage Vin6 is 3.0V, the first comparator 310 may output VC13 that is the first comparison signal VC1 corresponding to the input voltage Vin6 higher than the first reference voltage Vref1 (for example, 0V). In this case, V13 of the first comparison signal VC1 may correspond to 'T10+T13' that is the first count value of the first counter 410. The second comparator 320 may output VC23 that is the second comparison signal VC2 corresponding to the input voltage Vin6 higher than the second reference voltage Vref2 (for example, 1.65V). In this case, the second count value VC23 may correspond to the second count value T23 of the second counter 420.

In this case, the controller 450 may output the digital value Dout corresponding to the magnitude of the input voltage Vin, using 'T10+T13' that is the first count value of the first counter 410, and T23 that is the second count value of the second counter 420.

As an example, the first reference voltage Vref1 of the first comparator 310 may be a zero voltage, and the second reference voltage Vref2 of the second comparator 320 may be a voltage Vin_max/2 equal to ½ of the maximum voltage Vin_max of the input voltage.

In this case, the first comparator 310 compares the first voltage Vx from the integrating circuit 200 with the first reference voltage Vref1, a zero voltage, and may output the first comparison signal VC1 having a high-level voltage as illustrated in FIG. 5, when the first voltage Vx is higher than the first reference voltage Vref1, a z, a zero voltage.

The second comparator 320 compares the second reference voltage Vref2, a voltage Vin_max/2 equal to ½ of the maximum voltage Vin_max of the input voltage with the first voltage Vx, and may output the second comparison signal VC2 having a high-level voltage as illustrated in FIG. 5, when the first voltage Vx is higher than the second reference voltage Vref2.

Figure 6:
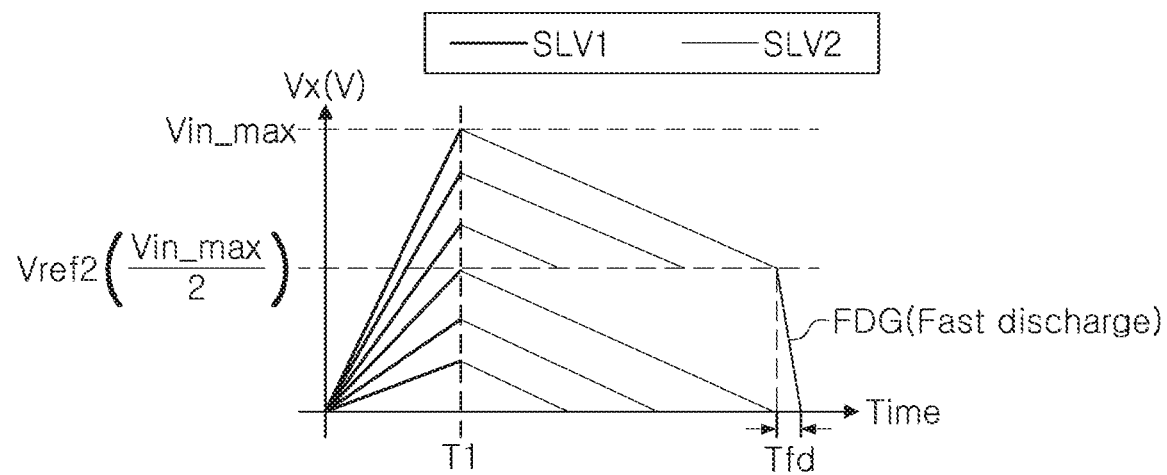
FIG. 6 is an explanatory diagram of a fast discharging operation of the fast discharge circuit of FIG. 4.

FIG. 6 is an explanatory diagram of a fast discharging operation of the fast discharge circuit of FIG. 4.

Referring to FIGS. 4 and 6, the discharge switch SW-D of the fast discharge circuit 350 is switched from an OFF state to an ON state after completion of the discharging operation. The discharge current source IS-D discharges a voltage at the first connection node N1 to a ground at high speed when the discharge switch SW-D is in an ON state.

Accordingly, as illustrated in a voltage discharge graph (FDG) of FIG. 6, the voltage at the first connection node N1 connected to the input terminals of the first and second comparators 310 and 320 is discharged at a high speed, and thus, the voltage at the input terminals of the first and second comparators 310 and 320 may rapidly become a ground potential in a short period of time Tfd.

Figure 7:
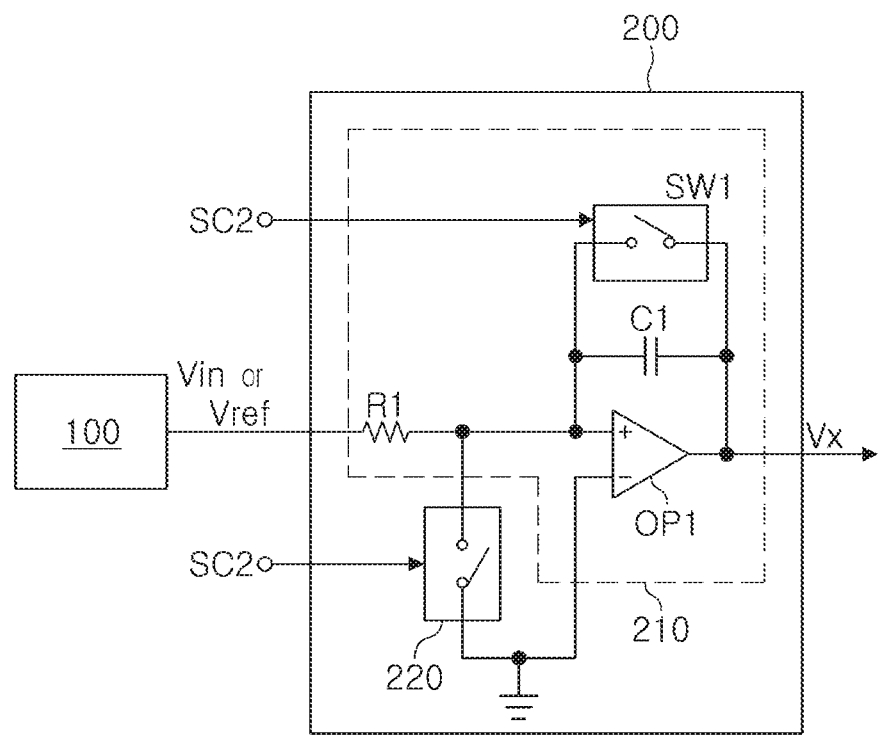
FIG. 7 is a diagram illustrating an example of the integrating circuit of FIG. 2.

FIG. 7 is a diagram illustrating an example of the integrating circuit of FIG. 2.

Referring to FIGS. 2 and 7, the integrating circuit 200 may include an integrator 210 and an offset elimination circuit 220.

The offset elimination circuit 220 is connected between a first input terminal and a second input terminal of the first operational amplifier OP1, and connects the first input terminal and the second input terminal of the first operational amplifier OP1 to each other after completion of the discharging operation, thereby removing a DC offset voltage of an input side of the first operational amplifier OP1.

The DC offset voltage of the operational amplifier of the integrating circuit is removed by the offset elimination circuit 220 after completion of the preceding counting operation, thereby performing the charging operation and the discharging operation for the following counting operation more accurately without error.

Figure 8:
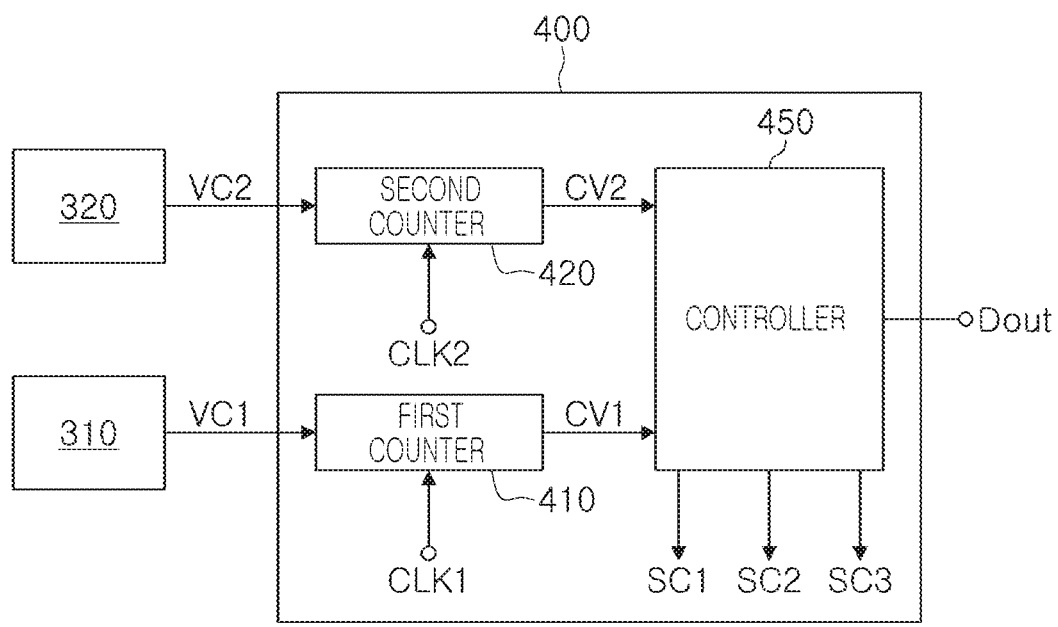
FIG. 8 is a diagram illustrating an example of a control circuit of FIG. 2.

FIG. 8 is a diagram illustrating an example of the control circuit of FIG. 2.

Referring to FIG. 8, the first counter 410 may count the first comparison signal VC1 using the first clock signal CLK1 to output the first count value CV1.

The second counter 420 counts the second comparison signal VC2 by using a second clock signal CLK2 having a phase different from that of the first clock signal CLK1 to output the second count value CV2.

The controller 450 may output the digital value Dout corresponding to the magnitude of the input voltage Vin, based on the first count value CV1 and the second count value CV2.

To reduce interference between a counting operation of the first counter 410 and a counting operation of the second counter 420, the first clock signal CLK1 and the second clock signal CLK2 may be set to have different phases.

As an example, the first clock signal CLK1 and the second clock signal CLK2 may be provided by separate clock generators or may be provided by the control circuit 400.

For example, a phase difference between the first clock signal CLK1 and the second clock signal CLK2 may be 90 degrees or 180 degrees.

Figure 9:
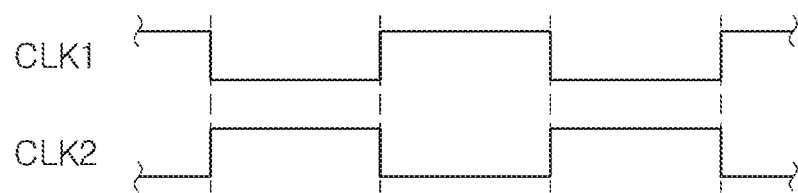
FIG. 9 is a diagram illustrating an example of a first clock signal and a second clock signal of FIG. 8.

FIG. 9 is a diagram illustrating an example of a first clock signal and a second clock signal of FIG. 8.

Referring to FIG. 9, for example, a phase difference between the first clock signal CLK1 and the second clock signal CLK2 may be 180 degrees.

Referring to FIGS. 8 and 9, the first counter 410 operates in response to the first clock signal CLK1 and the second counter 420 operates in response to the second clock signal CLK2. Thus, the resolution may be improved by adjusting the phase of the first and second clock signals capable of performing such parallel counting.

For example, when the phases of the first and second clock signals required for the parallel counting operation are 0 degree and 180 degrees, respectively, the overall resolution may be increased by 1 bit.

As another example, when four counters having a parallel structure are used, when phases of four clock signals supplied to the four counters are 0 degree, 90 degrees, 180 degrees, and 270 degrees, the overall resolution is increased to 3 bits.

A control circuit of a dual-slope analog-to-digital converter according to an example may be implemented in a computing environment of interconnection (for example, peripheral component interconnect (PCI), a USB, firmware (IEEE 1394), an optical bus structure, network, or the like) of a processor (for example, a central processing unit (CPU), a graphics processing unit (GPU), a microprocessor, an application specific integrated circuit (ASIC), field programmable gate arrays (FPGA), or the like), a memory (for example, a volatile memory (e.g. a RAM or the like), a non-volatile memory (e.g. a ROM, a flash memory, or the like), an input device (for example, a keyboard, a mouse, a pen, a voice input device, a touch input device, an infrared camera, a video input device, or the like), an output device (for example, a display, a speaker, a printer, or the like), a communications device (for example, a modem, a network interface card (NIC), an integrated network interface, a wireless frequency transmitter/receiver, an infrared port, a USB connection device or the like).

The computing environment may be implemented by a distributed computing environment including a personal computer, a server computer, a handheld or laptop device, a mobile device (a mobile phone, a PDA, a media player, and the like), a multiprocessor system, consumer electronics, a mini-computer, a mainframe computer, any of the aforementioned systems or devices, but an example thereof is not limited thereto.

As set forth above, in a dual-slope ADC according to the examples, resolution may be improved using a parallel counting structure, even when using a clock having the same frequency as that in the existing case.

In addition, after completion of the preceding counting operation, as the input voltage of a comparator included in a parallel counting structure is discharged at high speed, the following counting operation may be started more quickly and without error, thereby enabling a relatively faster counting operation.

In addition, after the completion of the preceding counting operation, as the direct current (DC) offset voltage of an operational amplifier of an integrating circuit is removed, a charging operation and a discharging operation for the following counting operation may be more accurately performed without error.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A dual-slope analog-to-digital converter (ADC) comprising:
    a switching circuit configured to select one of an input voltage for a charging operation and an input reference voltage for a discharging operation;
    an integrating circuit configured to perform the charging operation during a first slope of a magnitude of the input voltage selected by the switching circuit and the discharging operation during a second slope of a magnitude of the input reference voltage selected by the switching circuit, and output a first voltage varying responsively to the charging operation and the discharging operation;
    a dual comparison circuit configured to output a first comparison signal by comparing the first voltage with a first reference voltage and output a second comparison signal by comparing a second reference voltage, higher than the first reference voltage, with the first voltage; and
    a control circuit configured to output a digital value corresponding to the magnitude of the input voltage, based on a first count value of the first comparison signal and a second count value of the second comparison signal.

2. The dual-slope ADC of claim 1, wherein the switching circuit is configured to select the input voltage for the charging operation until a first time point elapses, and select the input reference voltage for the discharging operation after the first time point has elapsed.

3. The dual-slope ADC of claim 2, wherein the integrating circuit is configured to output the first voltage increasing to the first slope upon performing the charging operation until the first time point elapses, and output the first voltage decreasing to the second slope upon performing the discharging operation after the first time point has elapsed.

4. The dual-slope ADC of claim 1, wherein the integrating circuit comprises an integrator comprising:
    a first operational amplifier including a first input terminal connected to an output terminal of the switching circuit and a second input terminal connected to a ground;
    a first resistor connected to the first input terminal of the first operational amplifier;
    a first capacitor connected to the first operational amplifier in parallel, and connected between the first input terminal and the output terminal of the first operational amplifier; and
    a first switch connected to the first capacitor in parallel.

5. The dual-slope ADC of claim 4, wherein the integrating circuit further comprises an offset elimination circuit connected between the first input terminal and the second input terminal of the first operational amplifier to connect the first input terminal and the second input terminal to each other after completion of the discharging operation to remove a direct current (DC) offset voltage of an input side of the first operational amplifier.

6. The dual-slope ADC of claim 1, wherein the dual comparison circuit comprises:
    a first comparator configured to output the first comparison signal by comparing the first voltage from the integrating circuit with the first reference voltage;
    a second comparator configured to output the second comparison signal by comparing the second reference voltage, higher than the first reference voltage, with the first voltage; and
    a fast discharge circuit configured to discharge the input voltage of the comparison circuit after a counting operation of the control circuit.

7. The dual-slope ADC of claim 1, wherein the fast discharge circuit comprises a discharge switch and a discharge current source serially connected between a ground and a first connection node, between an output terminal of the integrating circuit and an input terminal of the second comparator,
    wherein the discharge switch is configured to be switched from an OFF state to an ON state, based on a third control signal after completion of a discharging operation of the integrating circuit, and
    wherein the discharge current source is configured to discharge a voltage at the first connection node to the ground when the discharge switch is in an ON state.

8. The dual-slope ADC of claim 1, wherein the control circuit comprises:

a first counter configured to count the first comparison signal, using a first clock signal, and output the first count value;

a second counter configured to count the second comparison signal, using a second clock signal having a phase different from a phase of the first clock signal by 90 degrees, and output the second count value; and a controller configured to output a digital value corresponding to the magnitude of the input voltage, based on the first count value and the second count value.

9. A dual-slope analog-to-digital converter (ADC) comprising:

a switching circuit configured to select one of an input voltage for a charging operation and an input reference voltage for a discharging operation;

an integrating circuit configured to perform the charging operation during a first slope of a magnitude of the input voltage selected by the switching circuit and the discharging operation during a second slope of a magnitude of the input reference voltage selected by the switching circuit, and output a first voltage varying responsively to the charging operation and the discharging operation;

a dual comparison circuit configured to output a first comparison signal by comparing the first voltage with a first reference voltage and output a second comparison signal by comparing a second reference voltage, higher than the first reference voltage, with the first voltage; and a control circuit configured to output a digital value corresponding to the magnitude of the input voltage, based on a first count value generated by counting the first comparison signal in response to a first clock signal and a second count value generated by counting the second comparison signal in response to a second clock signal having a phase different from a phase of the first clock signal.

10. The dual-slope ADC of claim 9, wherein the switching circuit is configured to select the input voltage for the charging operation until a first time point elapses, and select the input reference voltage for the discharging operation after the first time point has elapsed.

11. The dual-slope ADC of claim 10, wherein the integrating circuit is configured to output the first voltage increasing to the first slope upon performing the charging operation until the first time point elapses, and output the first voltage decreasing to the second slope upon performing the discharging operation after the first time point has elapsed.

12. The dual-slope ADC of claim 9, wherein the integrating circuit comprises an integrator comprising:

a first operational amplifier including a first input terminal connected to an output terminal of the switching circuit and a second input terminal connected to a ground;

a first resistor connected to the first input terminal of the first operational amplifier;

a first capacitor connected between an input terminal and an output terminal of the first operational amplifier in parallel, and connected between the first input terminal and the output terminal of the first operational amplifier; and a first switch connected between terminals of the first capacitor in parallel.

13. The dual-slope ADC of claim 12, wherein the integrating circuit further comprises an offset elimination circuit connected between the first input terminal and the second input terminal of the first operational amplifier to connect the first input terminal and the second input terminal after completion of the discharging operation to remove a direct current (DC) offset voltage of an input side of the first operational amplifier.

14. The dual-slope ADC of claim 9, wherein the dual comparison circuit comprises:

a first comparator configured to output the first comparison signal by comparing the first voltage from the integrating circuit with the first reference voltage;

a second comparator configured to output the second comparison signal by comparing the second reference voltage, higher than the first reference voltage, with the first voltage; and a fast discharge circuit configured to discharge the input voltage of the comparison circuit after a counting operation of the control circuit.

15. The dual-slope ADC of claim 9, wherein the fast discharge circuit comprises a discharge switch and a discharge current source serially connected between a ground and a first connection node between an output terminal of the integrating circuit and an input terminal of the second comparator, wherein the discharge switch is configured to be switched from an OFF state to an ON state, based on a third control signal after completion of a discharging operation of the integrating circuit, and wherein the discharge current source is configured to discharge a voltage at the first connection node to the ground when the discharge switch is in an ON state.

16. The dual-slope ADC of claim 9, wherein the control circuit comprises:

a first counter configured to count the first comparison signal, using the first clock signal, and output the first count value;

a second counter configured to count the second comparison signal, using the second clock signal having a phase different from a phase of the first clock signal by 180 degrees, and outputting the second count value; and a controller configured to output a digital value corresponding to the magnitude of the input voltage, based on the first count value and the second count value.

17. A dual-slope analog-to-digital converter (ADC) comprising:

a switching circuit configured to select one of an input voltage for a charging operation and an input reference voltage for a discharging operation;

an integrating circuit, connected to the selected input voltage and the selected input reference voltage, configured to perform the charging operation during a first slope of a magnitude of the selected input voltage and the discharging operation during a second slope of a magnitude of the input reference voltage, and output a first voltage varying responsively to the charging operation and the discharging operation;

a dual comparison circuit, connected to the first voltage, configured to output a first comparison signal by comparing the first voltage with a first reference voltage and output a second comparison signal by comparing a second reference voltage, higher than the first reference voltage, with the first voltage; and a control circuit, connected to the first comparison signal and the second comparison signal, configured to output a digital value corresponding to the magnitude of the input voltage, based on the first comparison signal and the second comparison signal.

18. The dual-slope ADC of claim 17, wherein the digital value corresponding to the magnitude of the input voltage is based on a first count value of the first comparison signal and a second count value of the second comparison signal, the first slope is different from the second slope, and the switching circuit is configured to select the input voltage for the charging operation until a first time point elapses, and select the input reference voltage for the discharging operation after the first time point has elapsed.

19. The dual-slope ADC of claim 18, wherein the integrating circuit comprises:

a first operational amplifier having a first input terminal connected to an output terminal of the switching circuit and a second input terminal connected to a ground; and a first capacitor connected to the first operational amplifier in parallel, and connected between the first input terminal and the output terminal of the first operational amplifier.

20. The dual-slope ADC of claim 19, wherein the first time point is a charging duration of the first capacitor, and the integrating circuit is further configured to output the first voltage increasing to the first slope upon performing the charging operation until the first time point elapses, and output the first voltage decreasing to the second slope upon performing the discharging operation after the first time point has elapsed.

* * * * *